United States Patent [19]

Tamura et al.

[11] Patent Number: 4,709,404

[45] Date of Patent: Nov. 24, 1987

[54] BATTERY-POWERED RADIO COMMUNICATION APPARATUS CAPABLE OF PROLONGING THE COMMUNICABLE STATE THEREOF

[75] Inventors: Yoshiharu Tamura; Katsuji Kimura, both of Tokyo, Japan

[73] Assignee: NEC Corporation, Japan

[21] Appl. No.: 765,358

[22] Filed: Aug. 13, 1985

[30] Foreign Application Priority Data

Aug. 14, 1984 [JP] Japan .................................. 59-168852

[51] Int. Cl.$^4$ ............................ H04B 1/04; H03F 3/04
[52] U.S. Cl. ........................................ 455/126; 455/73; 455/127; 330/297; 330/298; 330/207 P
[58] Field of Search ................... 455/73, 117, 126, 127, 455/116, 115; 330/128, 129, 207 P, 127, 297, 298

[56] References Cited

U.S. PATENT DOCUMENTS

| | | | |
|---|---|---|---|
| 4,114,108 | 9/1978 | Faulkenberry et al. | 455/126 |
| 4,158,180 | 6/1979 | Challen | 455/117 |
| 4,199,723 | 4/1980 | Cummings et al. | 455/126 |
| 4,353,037 | 10/1982 | Miller | 455/117 |
| 4,392,245 | 7/1983 | Mitama | 455/117 |
| 4,521,912 | 6/1985 | Franke et al. | 455/126 |
| 4,636,741 | 1/1987 | Mitzlaff | 330/297 |
| 4,654,882 | 3/1987 | Ikeda | 455/126 |

*Primary Examiner*—Jin P. Ng
*Attorney, Agent, or Firm*—Ostrolenk, Faber, Gerb & Soffen

[57] ABSTRACT

A battery-powered radio communication apparatus is disclosed which comprises a power amplifier and a power detector for detecting the output power of the power amplifier. A supply voltage detector compares a standard voltage with the output voltage of a battery supplying power to the power amplifier. A gain control circuit controls the gain of the power amplifier in response to the output of the power amplifier and to the output of the supply voltage detector so as to prolong, by a certain time, the communicable state of the apparatus prior to battery depletion.

12 Claims, 10 Drawing Figures

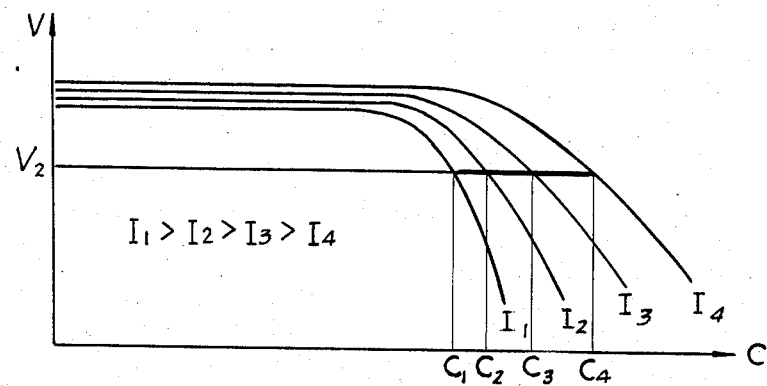
FIG_7
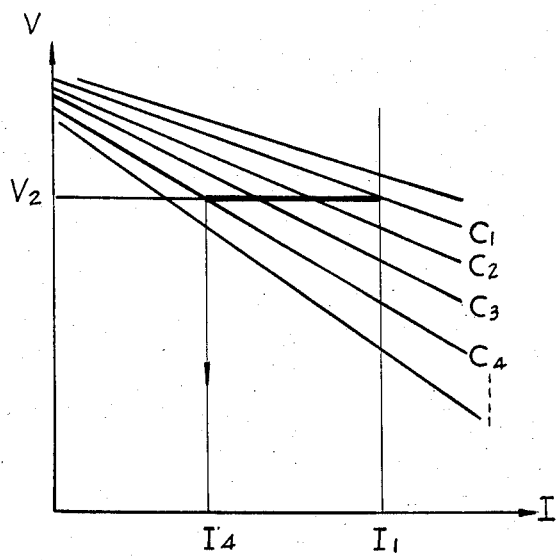
FIG_8

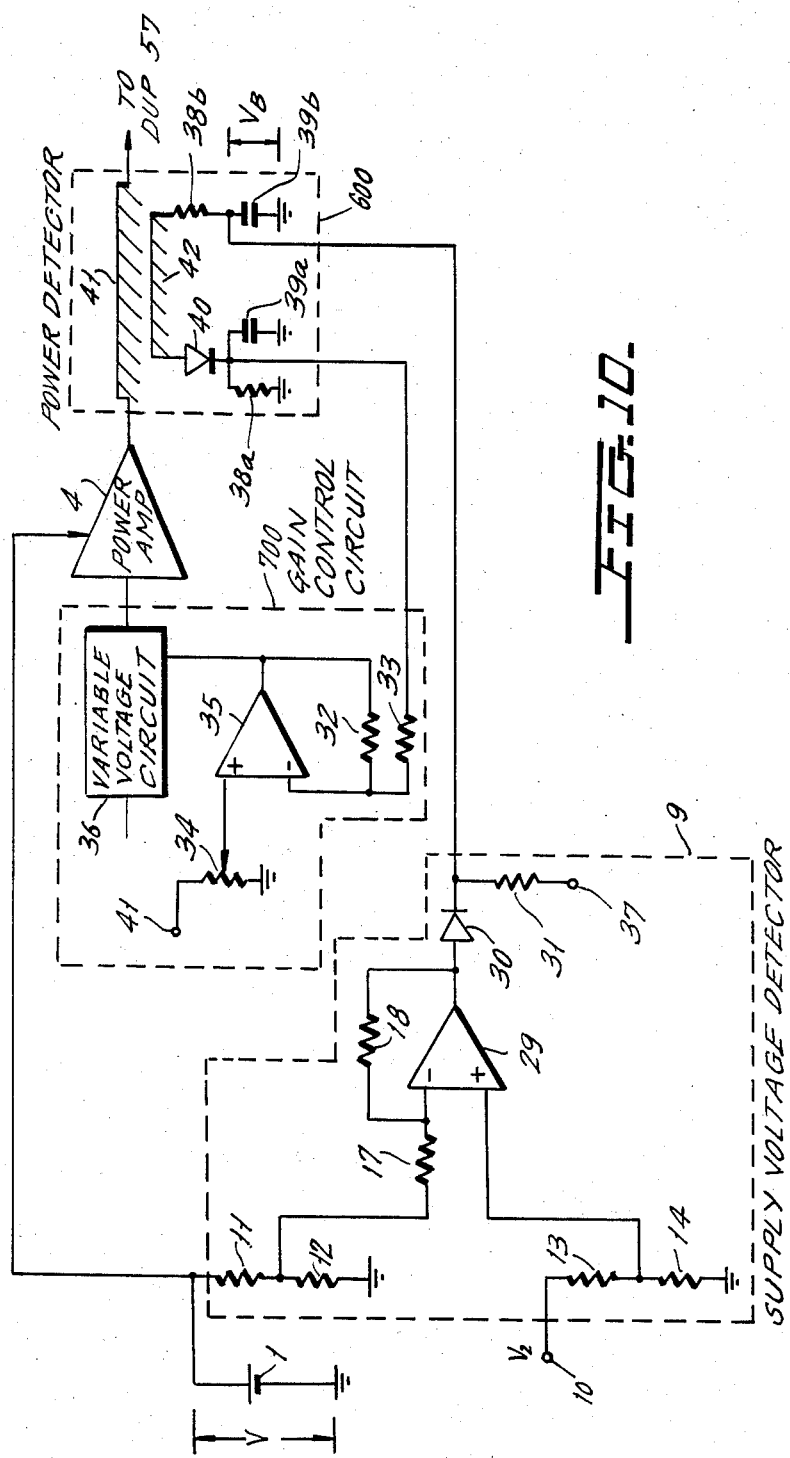

BATTERY-POWERED RADIO COMMUNICATION APPARATUS CAPABLE OF PROLONGING THE COMMUNICABLE STATE THEREOF

BACKGROUND OF THE INVENTION

This invention relates to a battery-powered radio communication apparatus and, more particularly, to a battery-powered radio communication apparatus with an automatic gain control (AGC) circuit at the power amplifier stage.

Portable battery-powered radio communication apparatus normally operates at a battery voltage which is higher than a preset voltage. When the battery voltage drops below the preset voltage, the radio communication apparatus of forced to be out of normal operation, which, in turn, results in interruption of communication. An AGC circuit, if provided at the stage of the power amplifier, works to keep the output power of the apparatus constant and, therefore, a drop in battery voltage causes an increase in current consumption. Accordingly, when beginning to drop, the battery voltage falls rapidly, as the case may be, below the preset voltage, with consequent interruption of communication.

SUMMARY OF THE INVENTION

Accordingly, it is an object of the invention to provide a battery-powered radio communication apparatus which permits communications to be kept up for some time after the battery voltage has fallen.

According to the invention, there is provided a radio communication apparatus comprising a power amplifier for amplifying an input signal, a battery for supplying power to the power amplifier, an AGC circuit responsive to the output of the power amplifier and to a control signal for controlling the gain of the power amplifier, and comparing means for comparing the output voltage of the battery with a standard voltage, and supplying the resultant signal to the AGC circuit as the control signal.

BRIEF DESCRIPTION OF THE DRAWINGS

Other objects, features and advantages of the invention will become more apparent from the description given hereinafter with reference to the accompanying drawings, in which

FIG. 7 is a graph illustrating discharge characteristics of a battery, taking load current as a parameter;

FIG. 8 is a graph illustrating the relationship, taking discharge capacity as a parameter, between the terminal voltage of battery and load current; and FIGS. 9 and 10 are block diagrams showing the detailed circuit structures of the power amplifier circuit and the supply voltage detector as shown in FIG. 4.

DETAILED DESCRIPTION OF THE INVENTION

Figure 1:
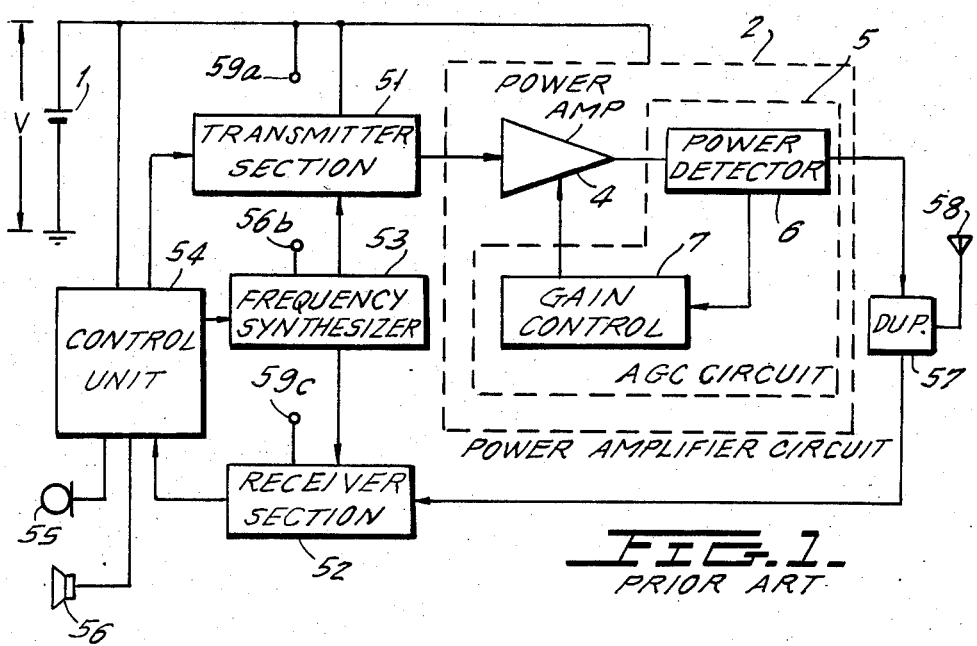
FIG. 1 is a block diagram of a conventional radio communication apparatus.

In FIG. 1, the conventional radio communication apparatus includes a transmitter section 51, a receiver section 52, a frequency synthesizer 53, a control unit 54 and a power amplifier circuit 2. A battery 1 supplies power to the above-mentioned sections or circuits. It is to be noted that a terminal 59a is connected to terminals 59b and 59c. A speech signal is inputted to the control unit 54 through a microphone 55 and in turn applied to the transmitter section 51. The transmitter section modulates a carrier wave with the speech signal and frequency converts the modulated carrier wave into a radio frequency signal. The power amplifier circuit 2 amplifies the radio frequency signal and supplies it to an antenna 58 via a duplexer 57 which radiates the amplified signal. The apparatus may comprise a keyboard with which data can be inputted to the unit 54. The data is radiated like the speech signal.

A transmitted signal which may contain a speech signal or data, is picked up by the antenna 58 and is supplied to the receiver section 52 through the duplexer 57. In the receiver section 52, the received signal is subjected to frequency conversion, demodulation or the like so as to become a baseband signal. When the received signal contains a speech signal, the speech signal is supplied to a speaker 56 by way of the control unit 54. When it contains data, the data is subjected to the necessary treatment within the control unit 54. Under the control of the control unit 54, the frequency synthesizer 53 supplies local oscillation signals to the transmitter and receiver sections 51 and 52 for the frequency conversion.

The power amplifier circuit 2 comprises an AGC circuit 5 which keeps the output power of the apparatus constant. In the AGC circuit 5, a power detector 6 detects the output power of a power amplifier 4 while a gain control circuit 7 controls the gain of the amplifier 4 in response to the detected output power. The power detector 6 and the gain control circuit 7 constitute a negative feedback loop. In general, the radio communication apparatus can operate normally at not lower than a certain battery voltage, which is minimum voltage $V_1$ (see FIG. 2). At voltages less than $V_1$, desired characteristics and functions can not be maintained properly, and undesired operation occurs. At the point of time $t_1$ corresponding to $V_1$, therefore, transmission is stopped, with replacement of the battery or charging the battery being required. This brings the apparatus into suspension or out of use until the return to voltage $V_0$.

Figure 2:
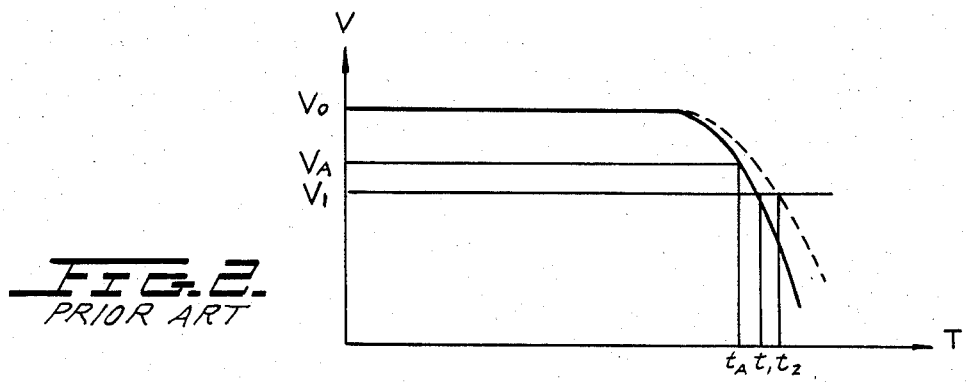
FIG 2 is a graph showing the time course of the terminal voltage of a battery connected to the apparatus of FIG. 1.
Figure 3:
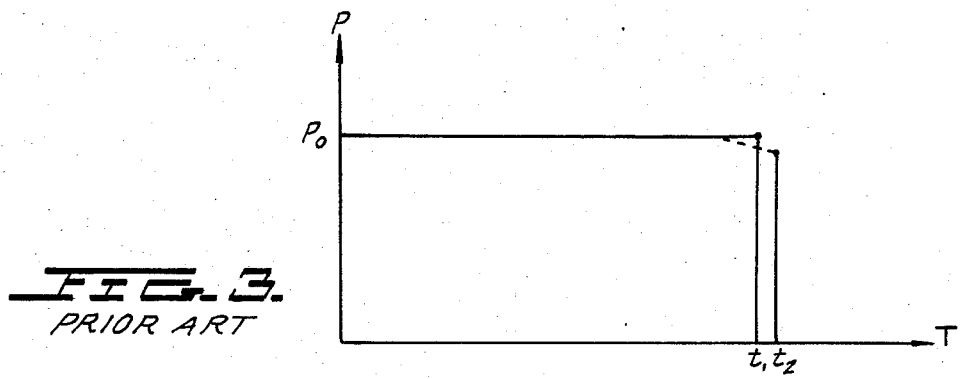
FIG. 3 is a graph showing the time course of transmission power of the apparatus of FIG. 1.

As shown in FIG. 2, a full-charged battery continues to apply a constant terminal voltage $V_0$ during a certain period and thereafter the terminal voltage falls gradually. The AGC circuit 5 operates to keep the output power constant independently of change in battery voltage. Therefore with the AGC circuit 5, ideally, a certain output power $P_0$ is maintained until time $t_1$ when the battery voltage becomes $V_1$, as indicated by the solid line in FIG. 3. In a non-ideal case where the battery voltage falls and the maximum output of power amplifier 4 is below $P_0$, owing to the effect of AGC circuit 5 which tries to maintain maximum output, power output will follow the time course indicated by the dotted line of FIG. 3, with a slight drop in power.

Thus, the current consumption reduces gradually, and the battery voltage becomes $V_1$ at time $t_2$. In practice, the prolonged time $t_2-t_1$ is only short and departure out of normal operation of such radio communication apparatus occurs suddenly. In order to avoid defects like this, there usually is designated battery voltage $V_A$ ($V_1<V_A<V_0$) at time $t_A$, at which point some alarm is given.

The prior art radio communication apparatus, however, is disadvantageous in that time length from time $t_A$, when the alarm is generated, to the time when the apparatus malfunctions ($t_1-t_A$ or $t_2-t_A$) is too short to satisfactorily avoid sudden interruption of communication.

Figure 4:
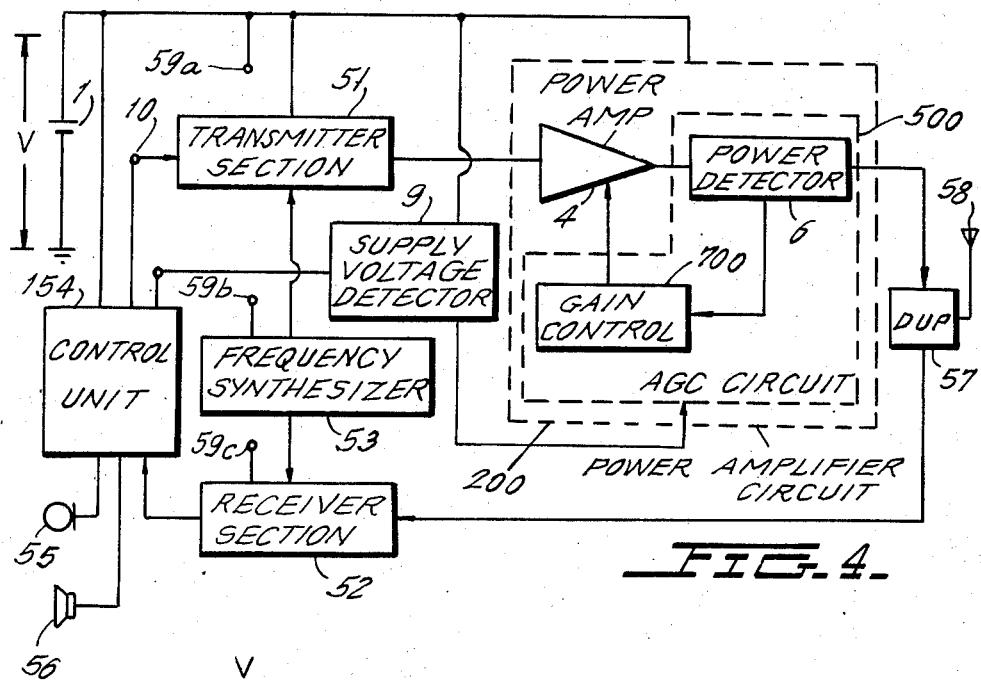
FIG. 4 is a block diagram of an embodiment of radio communication apparatus according to the invention.

A radio communication apparatus embodying the present invention is shown in FIG. 4. In FIG. 4, sections or circuits which are denoted by the same reference numerals as in FIG. 1, have the same functions as those in FIG. 1. Supply voltage detector 9, operates ony when the battery voltage V is lower than a standard preset voltage. Input terminal 10 indicates where the standard voltage is applied from control unit 154. The control unit 154 may include a Zener diode to produce the standard voltage from the battery voltage.

The supply voltage detector 9 determines whether or not the battery voltage V has become lower than the standard voltage by comparing them. When the voltage V becomes lower than the standard voltage, the supply voltage detector 9 supplies a control signal to AGC circuit 500. In response to the control signal, the AGC circuit 500 controls the gain of the power amplifier 4 so that the transmission power decreases to a certain level. This results in slowing the drop of voltage of the battery 1 and thereby prolongs the operative condition of the apparatus. The supply voltage detector 9, the power amplifier circuit 200 and power supply line constitute a negative feedback loop.

Figure 5:
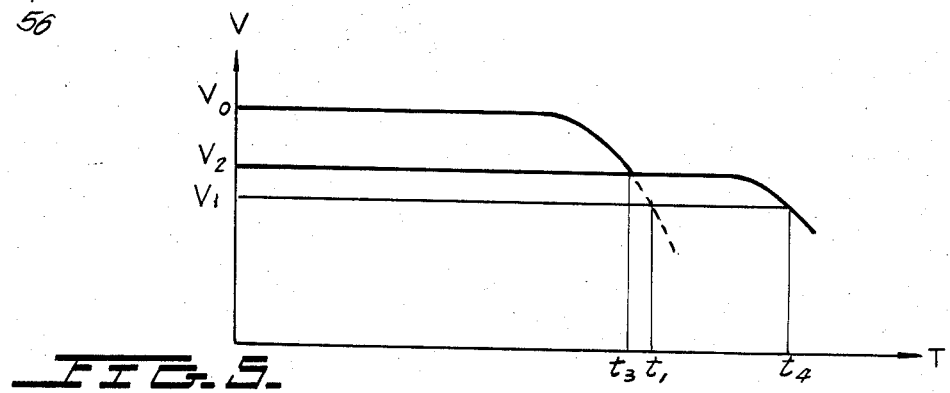
FIG. 5 is a graph showing the time course of the terminal voltage of a battery connected to the apparatus of FIG. 4.
Figure 6:
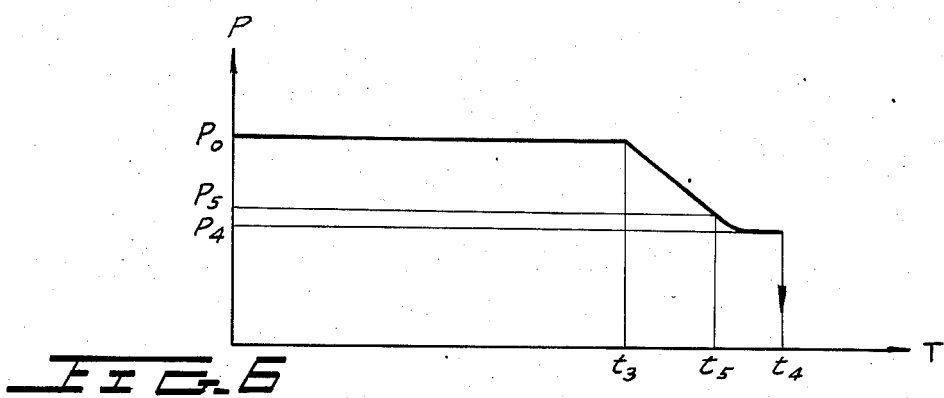
FIG. 6 is a graph showing the time course of transmission power of the apparatus of FIG. 4.

Suppose that $V_2$ where $V_1<V_2<V_0$, is taken as the standard voltage and that the negative feedback loop has a high loop gain. The power supply voltage V will be maintained at the standard voltage $V_2$ for some time after the voltage V has become the voltage $V_2$ at time $t_3$ (see FIG. 5). At $t_4$, the voltage V begins to again fall, since the total current used by of the radio communication apparatus does not fall below a certain level, even if transmission output power continues to decrease. The time-transmission power characteristic is shown in FIG. 6. When comparing FIGS. 2, 3, 5 and 6, it can be seen that $t_1<t_2<t_4$.

As shown in FIG. 6, when the transmission power P gradually drops, it passes a transmission output $P_5$ below which communication is highly deteriorated or becomes impossible due to the distance between transmitters or due to obstacles. Looking at the transmission power at time $t_4$ when the battery voltage V is $V_1$ be $P_4$, and taking $P_4<P_5$, it can be seen that incommunicability resulting from the drop in transmission power will occur at a time which is earlier than at a time which is due to a drop in the battery voltage below V1. It is clear that this tendency is greater in communication in the vicinity of the boundary of the communicable area. Thus, it follows that the greater the transmission power $P_0$ is, compared with the transmission power $P_5$, the more the communicable state of the apparatus is prolonged. Further, in an apparatus of the type in which the transmission is interrupted in response to the battery voltage being equal to $V_1$, the communication time can be lengthened by at least $t_5-t_1$, where transmission power $P_0$ is greater than transmission power $P_5$ ($P_5<P_0$).

The reasons for maintaining the battery voltage V at the standard voltage $V_2$ will now be described with reference to FIGS. 7 and 8. The battery voltage V at a certain discharge capacity C becomes high with decreasing load current. If the discharge capacity is changed from $C_1$ to $C_3$ at time $t_3$ (see FIG. 5), the current I decreases from $I_1$ to $I_3$ at voltage $V_2$ of FIG. 7. Likewise, when the voltage V is plotted with respect to the load current I, using discharge capacity C as a parameter, the graph as shown in FIG. 8 is obtained. Current $I_4$ is the maximum output-reduction value of the power amplifier circuit 200 or the minimum current consumption value of the apparatus.

Figure 9:
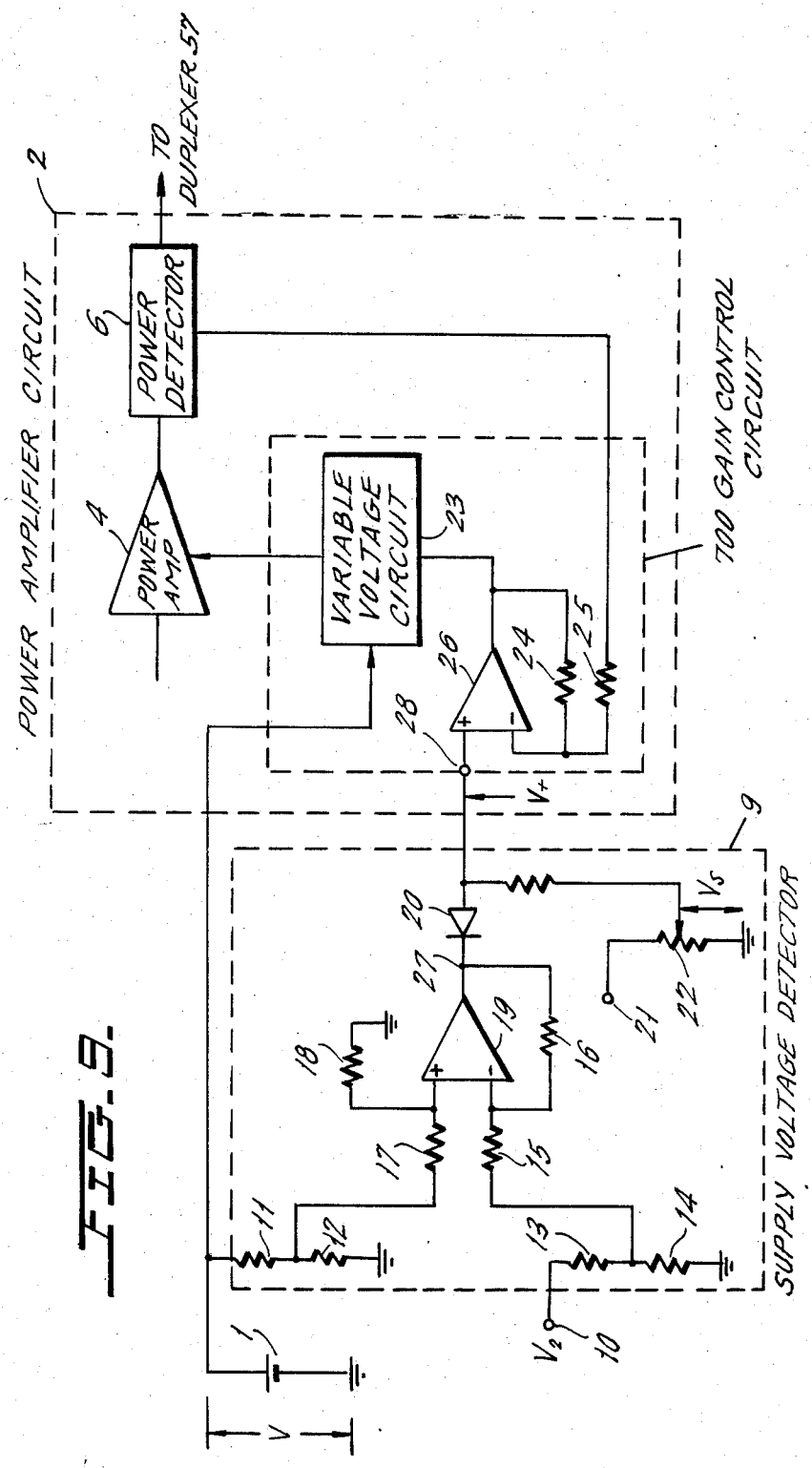

In FIG. 9, the power amplifier circuit 200 and the supply voltage detector 9 are shown in more detail. Reference numeral 21 denotes a voltage input terminal to which a constant voltage is applied from the control unit 154 (FIG. 4) and controls the output of the power amplifier circuit 2. A potentiometer 22 adjusts this constant voltage. A variable voltage circuit 23 is adapted to change the voltage applied from the battery 1 to the power amplifier 4.

A differential amplifier 19 amplifies the difference in voltage between the battery voltage V and the standard voltage $V_2$ and which are adjusted by voltage-divider resistors 11 and 12, and 13 and 14 to their appropriate voltages respectively. When the adjusted battery voltage is higher than the adjusted standard voltage, and the amplification factor of the differential amplifier 19 as determined by the ratio of resistors 15, 16 is sufficiently great, the voltage at the output terminal 27 becomes substantially equal to the adjusted battery voltage which is applied to the differential amplifier 19. When the voltage $V_+$ which is applied to the non-inverting input terminal 28 of differential amplifier 26 is lower than the voltage of the output terminal 27, the diode 20 will be in a non-conductive condition. As a result, the voltage $V_+$ becomes substantially equal to voltage $V_s$ as determined by the constant voltage applied to the voltage input terminal 21 and adjusted by the potentiometer 22. Thereafter, when the adjusted battery voltage becomes lower than the adjusted standard voltage, the voltage of the output terminal 27 will begin to rapidly fall, and diode 20 will be rendered conductive. Therefore, the voltage $V_+$ varies with voltage of the output terminal 27. Moreover, by letting the polarities of the differential amplifiers 19 and 26 be as shown in FIG. 9, the aforesaid negative feedback loop can be constituted. Accordingly, the amplifier 26 can control the voltage supplied to the power amplifier 4 in accordance with the variations of the battery voltage V.

Referring to FIG. 10, other circuit structures of the power amplifier circuit 200 and the supply voltage detector 9 are shown. A variable voltage circuit 36 changes the input voltage of the power amplifier 4 in response to the output of differential amplifier 35. Terminals 37 and 41 are supplied with constant voltages like the terminal 21 in FIG. 9. The radio communication apparatus shown in FIG. 10 operates the same as that shown in FIG. 9 except that the variable voltage circuit 36 is used while feedback loop is set by adjusting a voltage $V_B$ superposed on a power detector 600. If the battery voltage V falls below the standard voltage $V_2$, voltage $V_B$ will rise in accordance with the output of differential amplifier 29, resulting in the consequent drop of transmission power. As described above in detail, the battery-powered radio communication apparatus according to the invention permits a prolonged critical period of battery operation by, detecting the critical terminal voltage of the battery and thereafter causing the transmission output power to gradually fall. Thus, when some alarm is given as soon as the voltage has reached critical voltage, the interval from the time of generation of the alarm to the time of occurrence of incommunicability may be prolonged with the result that the unscheduled interruption of power may be prevented.

What is claimed is:

1. A radio communication apparatus comprising:
    power amplifier means for amplifying an input signal;
    battery means for supplying power to said power amplifier means;
    automatic gain control circuit means for maintaining the output power of said power amplifier means at a first predetermined level in response to the output of said power amplifier means and decreasing the output power of said power amplifier means to a second predetermined level in response to a control signal, said second predetermined level being lower than said first predetermined level; and
    comparing means for comparing the output voltage of said battery means with a standard voltage and supplying the resultant to said automatic gain control circuit means as said control signal, when the output voltage of said battery means falls below said standard voltage.

2. A radio communication apparatus as claimed in claim 1 wherein said automatic gain control circuit means is comprised of a power detector means for detecting the output power of said power amplifier means so as to provide a detected signal; and a gain control circuit means responsive to said detected signal and to said control signal for controlling a gain of said power amplifier means.

3. A radio communication apparatus as claimed in claim 2 wherein said comparing means is comprised of a first differential amplifier means for comparing the output voltage of said battery means with said standard voltage, and wherein said control circuit means comprises a second differential amplifier means for comparing the output of said first differential amplifier with said detected signal, and variable voltage circuit means responsive to the output of said second differential amplifier means for varying the supply power from said battery means to said power amplifier means.

4. A radio communication apparatus as claimed in claim 2 wherein said power detector means comprises a directional coupler means for branching the output of said power amplifier means, and a diode means for detecting the branched signal so as to provide said detected signal.

5. A radio communication apparatus as claimed in claim 2 wherein said power detector means detects the output voltage of said power amplifier means and wherein the detected voltage is superposed on the voltage of said control signal so as to provide a voltage-superposed signal, and said gain control circuit means is responsive to said voltage-superposed signal for changing the voltage of said input signal.

6. A radio communication apparatus as claimed in claim 5 wherein said comparing means comprises a first differential amplifier means for comparing the output voltage of said battery means with said standard voltage, and wherein said gain control circuit means comprises a second differential amplifier means for comparing a predetermined voltage with said voltage-superposed signal.

7. A radio communication apparatus as claimed in claim 5 wherein said power detector means comprises a directional coupler means for branching the output of said power amplifier means, and a diode means for detecting the branched signal so as to provide said detected voltage.

8. A method for prolonging the communicable state of a battery-powered radio communication apparatus, comprising the steps of:
    (a) detecting the output power of a power amplifier included in said apparatus so as to provide a detected signal;
    (b) providing a control signal when the voltage of the battery which supplies power to said power amplifier falls below a standard voltage;
    (c) maintaining, in response to said detected signal, the output power of said power amplifier at a first predetermined level; and
    (d) decreasing, in response to said control signal, the output power of said power amplifier to a second predetermined level, said second predetermined level being lower than said first predetermined level.

9. A method as claimed in claim 8 wherein in step (b) the voltage of said battery is compared with the standard voltage.

10. A method as claimed in claim 9 wherein in steps (c) and (d) the voltage of said detected signal is compared with the voltage of said control signal and in response to the result obtained, the supply voltage of said battery to said power amplifier is varied.

11. A method as claimed in claim 9 further comprising the additional steps of: (e) superposing said control signal on said detected signal so as to provide a voltage-superposed signal; and (f) varying, responsive to said voltage-superposed signal, the input signal voltage applied to said power amplifier.

12. A method as claimed in claim 8 wherein in step (a) the output of said power amplifier is branched and detected so as to provide said detected signal.

* * * * *